US011359278B2

(12) United States Patent
Nagatomo et al.

(10) Patent No.: US 11,359,278 B2
(45) Date of Patent: Jun. 14, 2022

(54) TREATMENT METHOD AND CLEANING METHOD FOR METAL OXYFLUORIDES

(71) Applicant: Central Glass Company, Limited, Ube (JP)

(72) Inventors: Masakiyo Nagatomo, Ube (JP); Akifumi Yao, Ube (JP)

(73) Assignee: Central Glass Company, Limited, Ube (JP)

(*) Notice: Subject to any disclaimer, the term of this patent is extended or adjusted under 35 U.S.C. 154(b) by 59 days.

(21) Appl. No.: 16/630,681

(22) PCT Filed: May 31, 2018

(86) PCT No.: PCT/JP2018/020917
§ 371 (c)(1),
(2) Date: Jan. 13, 2020

(87) PCT Pub. No.: WO2019/012841
PCT Pub. Date: Jan. 17, 2019

(65) Prior Publication Data
US 2021/0115556 A1 Apr. 22, 2021

(30) Foreign Application Priority Data
Jul. 14, 2017 (JP) .............................. JP2017-137765

(51) Int. Cl.
*C23C 16/44* (2006.01)
*B08B 5/00* (2006.01)
*B08B 7/00* (2006.01)
*B08B 7/04* (2006.01)
*B08B 9/08* (2006.01)
*C01G 39/04* (2006.01)
*C01G 41/04* (2006.01)
*C23C 16/30* (2006.01)

(52) U.S. Cl.
CPC ............ *C23C 16/4405* (2013.01); *B08B 5/00* (2013.01); *B08B 7/0071* (2013.01); *B08B 7/04* (2013.01); *B08B 9/08* (2013.01); *C01G 39/04* (2013.01); *C01G 41/04* (2013.01); *C23C 16/30* (2013.01)

(58) Field of Classification Search
CPC ..... C23C 16/44; C23C 16/4405; C23C 16/30; B08B 5/00; B08B 7/0071; B08B 7/04; B08B 9/08; C01G 39/04; C01G 41/04
USPC ......................................................... 423/53
See application file for complete search history.

(56) References Cited

U.S. PATENT DOCUMENTS

| | | | |
|---|---|---|---|
| 5,785,796 | A | 7/1998 | Lee |
| 6,090,208 | A | 7/2000 | Han |
| 2004/0077162 | A1 | 4/2004 | Leeson et al. |
| 2004/0255854 | A1 | 12/2004 | Sakai et al. |
| 2010/0154835 | A1 | 6/2010 | Dimeo et al. |
| 2014/0236276 | A1 | 8/2014 | Young et al. |
| 2017/0200602 | A1 | 7/2017 | Kikuchi et al. |

FOREIGN PATENT DOCUMENTS

| | | | |
|---|---|---|---|
| CN | 1497666 A | 5/2004 | |
| CN | 1579010 A | 2/2005 | |
| CN | 102747336 A | 10/2012 | |
| JP | 63-241185 A | 10/1988 | |
| JP | 63241185 | * 10/1988 | ............ C23C 16/56 |
| JP | 7-86187 A | 3/1995 | |
| JP | 2004-137556 A | 5/2004 | |
| JP | 2012-251212 A | 12/2012 | |
| KR | 10-2017-0019460 A | 2/2017 | |

OTHER PUBLICATIONS

JP 63-241185 English Translation, accessed on Apr. 2021. (Year: 1988).*
Chinese language Office Action issued in Chinese Application No. 201880041939.9 dated May 24, 2021 with English translation (17 pages).
Korean language Office Action issued in Korean Application No. 10-2020-7003806 dated May 24, 2021 with English translation (15 pages).
International Search Report (PCT/ISA/210) issued in PCT Application No. PCT/JP2018/020917 dated Aug. 28, 2018 with English translation (four pages).
Japanese-language Written Opinion (PCT/ISA/237) issued in PCT Application No. PCT/JP2018/020917 dated Aug. 28, 2018 (four pages).

* cited by examiner

*Primary Examiner* — Edward M Johnson
(74) *Attorney, Agent, or Firm* — Crowell & Moring LLP (57) ABSTRACT

A treatment method according to the present invention includes bringing a metal oxyfluoride of the general formula: $MO_{(6-x)/2}F_x$ (where $0<x<6$; and M=W or Mo) into contact with a fluorine-containing gas at a reaction temperature higher than or equal to 0° C. and lower than 400° C., thereby converting the metal oxyfluoride to a metal hexafluoride of the general formula: $MF_6$ (where M=W or Mo). This treatment method enables conversion of the metal oxyfluoride to the high vapor pressure compound without the use of a plasma generator and can be applied to cleaning of a metal fluoride production apparatus or cleaning of a film forming apparatus.

11 Claims, 3 Drawing Sheets

TREATMENT METHOD AND CLEANING METHOD FOR METAL OXYFLUORIDES

FIELD OF THE INVENTION

The present invention relates to a treatment method for converting a metal oxyfluoride $MO_{(6-x)/2}F_x$ (where $0<x<6$; and $M=W$ or $Mo$) to $MF_6$ by chemical reaction with a fluorine-containing gas and to a cleaning method for removing a deposit of the metal oxyfluoride by using this treatment method.

BACKGROUND ART

Tungsten hexafluoride and molybdenum hexafluoride are respectively known as precursors for chemical vapor depositions of tungsten (W) or tungsten compound and molybdenum (Mo) or molybdenum compound. There are known industrial production methods of these precursor compounds by contact of metal tungsten with fluorine or nitrogen trifluoride and by contact of metal molybdenum with fluorine or nitrogen trifluoride as shown in the reaction schemes (1-1) to (1-2) and in the reaction schemes (2-1) to (2-1).

| | |
|---|---|
| $W(s)+3F_2(g) \rightarrow WF_6(g)$ | Reaction Scheme (1-1) |
| $W(s)+2NF_3(g) \rightarrow WF_6(g)+N_2(g)$ | Reaction Scheme (1-2) |
| $Mo(s)+3F_2(g) \rightarrow MoF_6(g)$ | Reaction Scheme (2-1) |
| $Mo(s)+2NF_3(g) \rightarrow MoF_6(g)+N_2(g)$ | Reaction Scheme (2-2) |

In the industrial production methods of tungsten hexafluoride and molybdenum hexafluoride, metal tungsten and metal molybdenum are used as mentioned above. However, each of the metal tungsten and the metal molybdenum contains a metal oxide, a surface oxide etc. as impurities. By reaction of these oxides with the raw material gas such as fluorine or nitrogen trifluoride, a metal oxyfluoride $MO_{(6-x)/2}F_x$ (where $0<x<6$; and $M=W$ or $Mo$) such as $WOF_4$ or $MoOF_4$ is formed as an impurity.

| | |
|---|---|
| $WO_3(s)+2F_2(g) \rightarrow WOF_4+O_2(g)$ | Reaction Scheme (3-1) |
| $WO_3(s)+4/3NF_3(g) \rightarrow WOF_4+O_2(g)+2/3N_2(g)$ | Reaction Scheme (3-2) |
| $MoO_3(s)+2F_2(g) \rightarrow MoOF_4+O_2(g)$ | Reaction Scheme (4-1) |
| $MoO_3(s)+4/3NF_3(g) \rightarrow MoOF_4+O_2(g)+2/3N_2(g)$ | Reaction Scheme (4-2) |

A metal oxyfluoride is also formed by reaction of the product such as tungsten hexafluoride or molybdenum hexafluoride product with the metal oxide.

| | |
|---|---|
| $WO_3(s)+2WF_6(g) \rightarrow 3WOF_4$ | Reaction Scheme (3-3) |
| $MoO_3(s)+2MoF_6(g) \rightarrow 3MoOF_4$ | Reaction Scheme (4-3) |

Further, a metal oxyfluoride is formed by reaction of the product such as tungsten hexafluoride or molybdenum hexafluoride with water ($H_2O$).

| | |
|---|---|
| $H_2O+WF_6(g) \rightarrow WOF_4+2HF$ | Reaction Scheme (3-4) |
| $H_2O+MoF_6(g) \rightarrow MoOF_4+2HF$ | Reaction Scheme (4-4) |

When the tungsten hexafluoride or molybdenum hexafluoride is used as a precursor for chemical vapor deposition of tungsten/tungsten compound or molybdenum/molybdenum compound on a treatment target substrate such as Si wafer, it is conceivable to allow reaction of the tungsten hexafluoride or molybdenum hexafluoride with Si in the Si wafer (see the reaction schemes (5-1) and (6-1)) or allow reaction of the tungsten hexafluoride or molybdenum hexafluoride with added $H_2$ (see the reaction schemes (5-2) and (6-2)). In the case where the Si wafer used as the treatment target substrate contains $SiO_2$ in the form of a natural oxide film, however, the tungsten hexafluoride is reacted with $SiO_2$ to form a metal oxyfluoride (see the reaction scheme (5-3)). The tungsten hexafluoride is also reacted with water in the treatment chamber to form a metal oxyfluoride (see the reaction scheme (3-4)). The molybdenum hexafluoride undergoes similar reactions to form a metal oxyfluoride (see the reaction schemes (6-3) and (4-4)).

| | |
|---|---|
| $2WF_6+3Si \rightarrow 2W+3SiF_4$ | Reaction Scheme (5-1) |
| $WF_6+3H_2 \rightarrow W+6HF$ | Reaction Scheme (5-2) |
| $2WF_6+SiO_2 \rightarrow 2WOF_4+3SiF_4$ | Reaction Scheme (5-3) |
| $2MoF_6+3Si \rightarrow 2Mo+3SiF_4$ | Reaction Scheme (6-1) |
| $MoF_6+3H_2 \rightarrow Mo+6HF$ | Reaction Scheme (6-2) |
| $2MoF_6+SiO_2 \rightarrow 2MoOF_4+3SiF_4$ | Reaction Scheme (6-3) |

Herein, the boiling point and melting point of the metal oxyfluoride at 1 atmospheric pressure are shown in TABLE 1.

TABLE 1

| Metal oxyfluoride | Boiling point | Melting point |
|---|---|---|
| $WOF_4$ | 187° C. | 106° C. |
| $MoOF_4$ | 186° C. | 98° C. |

The metal oxyfluoride has a high boiling point and melting point and is solid at atmospheric temperatures and pressures. It is thus likely that the metal oxyfluoride will be deposited as a white solid in an apparatus. The occurrence of such a deposit becomes a cause of trouble including clogging of the apparatus or piping system. Furthermore, the metal oxyfluoride $MO_{(6-x)/2}F_x$ (where $0<x<6$; and $M=W$ or $Mo$; as exemplified by $MOF_4$) has high moisture absorbency. In the case of trying to remove this metal oxyfluoride by a wet cleaning process open to the atmosphere or containing water, the metal oxyfluoride is converted by hydrolysis to a metal oxyfluoride $MO_{(6-y)/2}F_y$ (where $0<y<6$ with the proviso that y is smaller than x in the general formula of the metal oxyfluoride before the reaction; and $M=W$ or $Mo$; as exemplified by $MO_2F_2$) and hydrogen fluoride and then finally converted to an oxide which is difficult to remove, as shown in the reaction schemes (7-1) to (7-2) and in the reaction schemes (8-1) to (8-2). When the metal oxyfluoride is converted to the oxide, it becomes necessary to perform wet cleaning with an aqueous alkaline solution.

| | |
|---|---|
| $WOF_4+H_2O \rightarrow WO_2F_2+2HF$ | Reaction Scheme (7-1) |
| $WO_2F_2H_2O \rightarrow WO_3+2HF$ | Reaction Scheme (7-2) |
| $MoOF_4+H_2O \rightarrow MoO_2F_2+2HF$ | Reaction Scheme (8-1) |
| $MoO_2F_2+H_2O \rightarrow MoO_3+2HF$ | Reaction Scheme (8-2) |

One conceivable method for dry removal of the metal oxyfluoride is to vaporize the metal oxyfluoride by heating the apparatus. For example, Patent Document 1 discloses a method of preventing an exhaust system of a chemical vapor deposition apparatus from being clogged with $WOF_4$, by flowing a heated gas (such as dry air, nitrogen or inert gas) of 20 to 260° C. at 10 to 300 L/min (in a standard state). Patent Document 2 discloses a method of removing a by-product such as $WOF_4$ generated during the formation of a tungsten film from $WF_6$ in a chemical vapor deposition apparatus, by heating the apparatus to 300 to 600° C. after the film formation.

Another conceivable method for dry removal of the metal oxyfluoride is to convert the metal oxyfluoride to a high vapor pressure compound. For example, Patent Document 3 discloses a method of removing a by-product deposited in a chemical vapor deposition apparatus during the formation of a tungsten film, by converting the by-product to a gaseous substance and removing the gaseous substance while detecting the peak intensity of at least one of $WF_5^+$, $WOF_4^+$ and $CO^+$ with the use of a fluorocarbon gas ($C_3F_8$) in a plasma-assisted environment.

PRIOR ART DOCUMENTS

Patent Documents

Patent Document 1: U.S. Pat. No. 6,090,208
Patent Document 2: Japanese Laid-Open Patent Publication No. S63-241185
Patent Document 3: Japanese Laid-Open Patent Publication No. 2004-137556

SUMMARY OF THE INVENTION

The method of Patent Document 1 uses a large amount of heated gas for the removal of $WO_4$ and presents the problem that, in the case of introducing a large amount of heated gas into an industrial-scale continuous production apparatus, it is necessary to stop the production process or to increase the concentration of inert gas in the process gas. The method of Patent Document 1 is thus difficult to apply. The method of Patent Document 2 presents the problems that: it takes time to heat and cool the apparatus; and it is necessary to heat not only the apparatus but also the discharge site subsequent to the apparatus. The method of Patent Document 2 is thus difficult to apply to the industrial-scale apparatus. The method of Patent Document 3 presents the problems that, in the case of a production apparatus of a metal hexafluoride, the fluorocarbon is mixed as an impurity in the product; and it is necessary to arrange a plasma generator over the entire production apparatus. The method of Patent Document 3 is thus difficult to apply the industrial-scale continuous production apparatus.

In view of the foregoing, it is an object of the present invention to a treatment method for converting a metal oxyfluoride to a high vapor pressure compound without the use of a plasma generator and to provide a cleaning method for removing a metal oxyfluoride by a dry process using this treatment method.

Means for Solving the Problems

As a result of extensive researches made to achieve the above object, the present inventors have reached a finding that it is possible to convert a metal oxyfluoride to a metal hexafluoride with a high vapor pressure by bringing the metal oxyfluoride into contact with a fluorine-containing gas. The present invention is based on such a finding. More specifically, the present inventors have found that the above object can be achieved by converting tungsten oxyfluoride or molybdenum oxyfluoride to tungsten hexafluoride (melting point: 2.3° C., boiling point: 17.1° C.) or molybdenum oxyfluoride (melting point: 17.5° C., boiling point: 34.0° C.) through contact reaction of tungsten oxyfluoride or molybdenum oxyfluoride with a fluorine-containing gas as shown in the reaction schemes (9-1) to (9-4).

Reaction Scheme (9-1)

Reaction Scheme (9-2)

Reaction Scheme (9-3)

Reaction Scheme (9-4)

In the above schemes, M represents tungsten or molybdenum.

Accordingly, one aspect of the present invention is a treatment method for a metal oxyfluoride, comprising: bringing a metal oxyfluoride of the general formula: $MO_{(6-x)/2}F_x$ (where $0<x<6$; and M=W or Mo) into contact with a fluorine-containing gas at a temperature higher than or equal to 0° C. and lower than 400° C., thereby converting the metal oxyfluoride to a metal hexafluoride of the general formula: $MF_6$ (where M=W or Mo).

Another aspect of the present invention is a cleaning method of a metal fluoride production apparatus, the metal fluoride production apparatus being configured for producing a metal hexafluoride of the general formula: $MF_6$ (where M=W or Mo), the cleaning method comprising: converting a metal oxyfluoride of the general formula: $MO_{(6-x)/2}F_x$ (where $0<x<6$; and M=W or Mo) deposited on an inner surface of the metal fluoride production apparatus to a metal hexafluoride by the above treatment method and thereby removing the metal oxyfluoride.

Still another aspect of the present invention is a cleaning method of a film forming apparatus, the film forming apparatus being configured for forming a film from a metal hexafluoride of the general formula: $MF_6$ (where M=W or Mo), the cleaning method comprising: converting a metal oxyfluoride of the general formula: $MO_{(6-x)/2}F_x$ (where $0<x<6$; and M=W or Mo) deposited on an inner surface of the film forming apparatus to a metal hexafluoride by the above treatment method and thereby removing the metal oxyfluoride.

Effects of the Invention

The treatment method for the metal oxyfluoride according to the present invention enables the removal of a deposit of the metal oxyfluoride without the use of a large amount of heated gas or a plasma generator.

DETAILED DESCRIPTION OF EMBODIMENTS

Embodiments of a treatment method and cleaning methods for metal oxyfluorides according to the present invention will be described in detail below. It should be understood that the present invention is not limited to the following embodiments.

The treatment method and cleaning methods according to the present invention are characterized by bringing a metal oxyfluoride of the general formula: $MO_{(6-x)/2}F_x$ (where $0<x<6$; and M=W or Mo) into contact with a fluorine-containing gas at a temperature higher than or equal to 0° C. and lower than 400° C., thereby converting the metal oxyfluoride to a metal hexafluoride of the general formula: $MF_6$ (where M=W or Mo).

By bringing the metal oxyfluoride into contact with the fluorine-containing gas, the metal oxyfluoride is converted to the metal hexafluoride through chemical reaction as shown in the above reaction schemes (9-1) to (9-4). The metal hexafluoride such as tungsten hexafluoride (melting point: 2.3° C., boiling point: 17.1° C.) or molybdenum oxyfluoride (melting point: 17.5° C., boiling point: 34.0° C.) formed by conversion from the metal oxyfluoride such as $WOF_4$ (melting point: 106° C., boiling point: 187° C.) or $MoF_4$ (melting point: 98° C., boiling point: 186° C.) is high in vapor pressure. Thus, dry cleaning and removal of the metal oxyfluoride deposited in the apparatus is accomplished by conversion of the metal oxyfluoride to the metal hexafluoride.

It is preferable that the fluorine-containing gas is any selected from $F_2$ gas, $NF_3$ gas, $ClF_3$ gas and $IF_7$ gas. The $F_2$ gas and the $NF_3$ gas are preferred in that only a gas easy to separate, such as oxygen gas or nitrogen gas, is generated. The $ClF_3$ gas and the $IF_7$ gas are preferred in that the reaction of these gases with the metal oxyfluoride proceeds rapid so as to allow rapid conversion of the metal oxyfluoride to the metal hexafluoride for quick removal of the metal oxyfluoride.

The temperature of the chemical contact reaction between the metal oxyfluoride and the fluorine-containing gas is preferably higher than or equal to 0° C. and lower than or equal to 400° C., more preferably higher than or equal to 10° C. and lower than or equal to 200° C., still more preferably higher than or equal to 50° C. and lower than or equal to 200° C. When the reaction temperature is lower than or equal to 0° C., the metal hexafluoride $MF_6$ (M=W or Mo) formed in the reaction may be undesirably liquefied or solidified on the metal oxyfluoride so that the fluorine-containing gas and the metal oxyfluoride are not efficiently brought into contact with each other. When the reaction temperature is lower than or equal to 50° C., $ClO_2F$ gas may be generated as a by-product of the reaction with the use of $ClF_3$ gas as the fluorine-containing gas; $IOF_5$ gas may be generated as a by-product of the reaction with the use of $IF_7$ gas as the fluorine-containing gas. The generation of such a by-product gas would not interfere with implementation of the present invention. When the reaction temperature is higher than or equal to 400° C., the apparatus may be undesirably corroded by the fluorine-containing gas. The present invention is particularly advantageous in that the metal oxyfluoride can be removed, even at a temperature lower than or equal to the boiling point, by fluorination of the metal oxyfluoride with the fluorine-containing gas.

Further, the contact pressure of the metal oxyfluoride and the fluorine-containing gas in the reaction is preferably in the range of 0.01 kPa to 300 kPa, more preferably 0.01 kPa to 100 kPa, in terms of absolute pressure. When the contact pressure is lower than 0.01 kPa in terms of absolute pressure, the load on the equipment for maintaining the pressure may become undesirably high. When the contact pressure is higher than 300 kPa in terms of absolute pressure, there may undesirably occur leakage of the fluorine-containing gas from the apparatus.

For the purpose of decreasing the partial pressures of the fluorine-containing gas, the metal oxyfluoride and the metal hexafluoride so as to prevent liquefaction or solidification of these gases and to allow the reaction of the fluorine-containing gas and the metal oxyfluoride to proceed gently, the fluorine-containing gas may be diluted with an inert gas. The inert gas can be of a kind that does not react with the fluorine-containing gas, the metal oxyfluoride and the metal hexafluoride. Preferred examples of the inert gas are nitrogen gas, argon gas, helium gas and the like. Among others, nitrogen gas is particularly preferred because of its low cost.

Since the metal oxyfluoride is converted to an oxide by reaction with water in the gas, it is preferable that the content of water in the fluorine-containing gas and the inert gas is low. For example, the content of water in the gas is preferably lower than 10 volume ppm. It is feasible to supply the fluorine-containing gas by either a continuous system or a batch system. The supply system of the fluorine-containing gas can be selected as appropriate.

The treatment method and cleaning methods according to the present invention enable dry removal of the metal oxyfluoride without the use of plasma. It is therefore possible in the present invention to remove the metal oxyfluoride at low cost. The metal oxyfluoride, even at a location where it is difficult to place a plasma generator, can be removed.

Differently from the method of Patent Document 1 in which the metal oxyfluoride is removed with the use of a large amount of heated gas but without the aid of chemical reaction, the treatment method and cleaning methods for the metal oxyfluorides according to the present invention is characterized in that the metal oxyfluoride is converted to the metal hexafluoride by chemical reaction with the fluorine-containing gas and thereby removed as the metal hexafluoride. As the amount of the fluorine-containing gas used is small, the total amount of the gas fed through the apparatus is small. Consequently, the load on the apparatus to which the treatment method or cleaning method according to the present invention is applied is lowered.

(Cleaning Method of Metal Fluoride Production Apparatus)

A cleaning method of a metal fluoride production apparatus using the treatment method for the metal oxyfluoride according to the present invention will be explained below with reference to FIG. 1.

Figure 1:
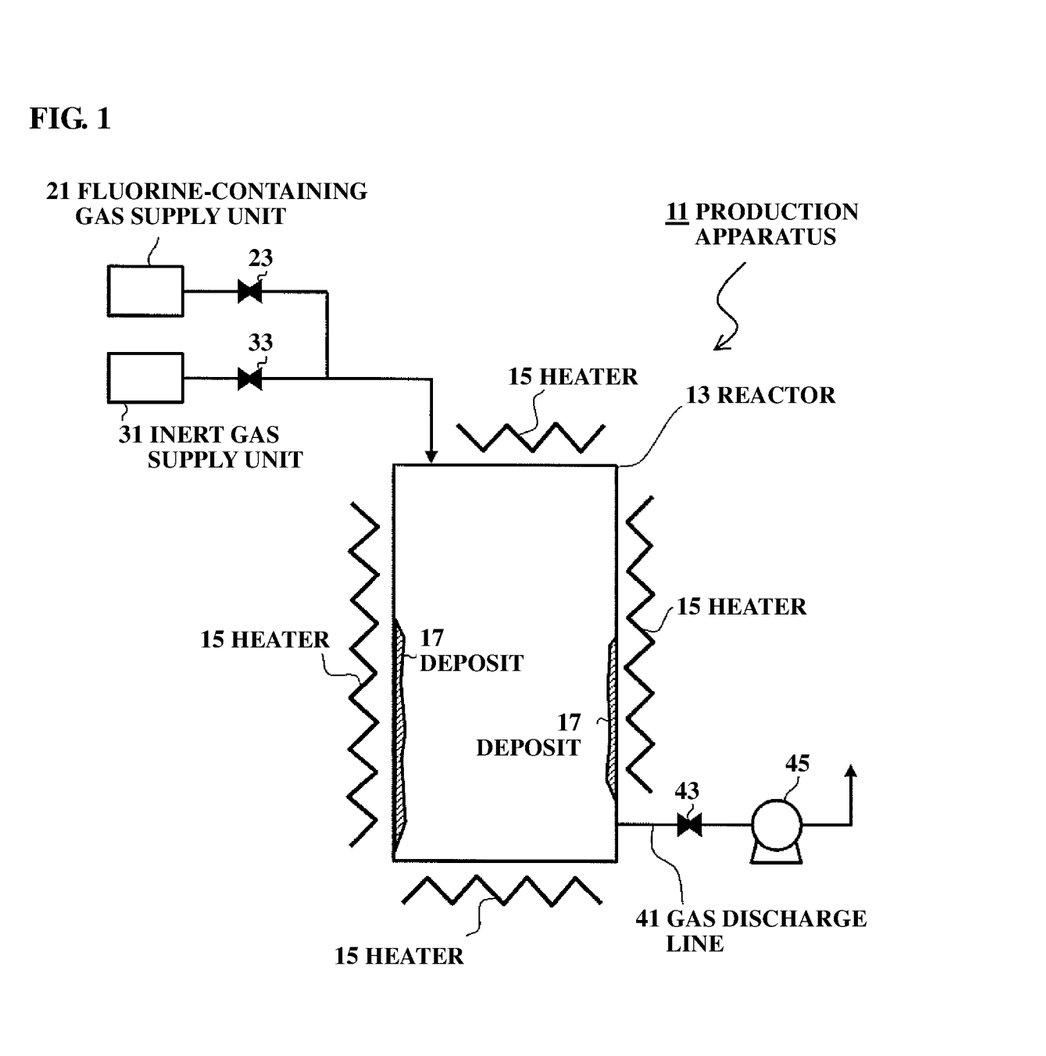
FIG. 1 is a schematic view of a cleaning method of a metal fluoride production apparatus according to one embodiment of the present invention.

As shown in FIG. 1, the metal fluoride production apparatus 11 has a reactor 13. For production of a metal fluoride, metal tungsten or metal molybdenum in powdery form, granular form or bulk form is charged in the reactor 13; and fluorine gas, nitrogen trifluoride gas or the like is supplied into the reactor 13. Then, the metal fluoride such as metal hexafluoride is obtained in gaseous form. During the reaction, a metal fluoride is generated as shown in the above reaction scheme (3-1) etc. and left as a deposit 17 on an inner surface of the reactor 13 or piping system. The following explanation will be given to the cleaning of the metal fluoride production apparatus 11 in which the deposit 17 is present on the inner surface of the reactor 13.

A heater 15 is disposed around the reactor 13 such that the inside of the reactor can be heated by the heater. The fluorine-containing gas is supplied from a fluorine-containing gas supply unit 21 into the reactor 13, whereas the inert gas is supplied from an inert gas supply unit 31 into the reactor 13. The gas is discharged from the reactor through a gas discharge line 41 by a gas discharge device 45.

The cleaning is performed by supplying the fluorine-containing gas and optionally the inert gas into the reactor 13 while heating the inner surface of the reactor 13 to a predetermined temperature by the heater 15 as needed or leaving the inner surface of the reactor 13 at room temperature. When the fluorine-containing gas is reacted with the deposit 17 of metal oxyfluoride, the metal oxyfluoride is converted to a metal hexafluoride and thus removed as a volatile gas.

In this method, the deposit 17 inside the metal fluoride production apparatus 11 is removed by a dry process without the use of a plasma generator and with the reactor 13 being open to the atmosphere.

(Cleaning Method of Film Forming Apparatus)

A cleaning method of a film forming apparatus using the treatment method for the metal oxyfluoride according to the present invention will be next explained below with reference to FIG. 2.

Figure 2:
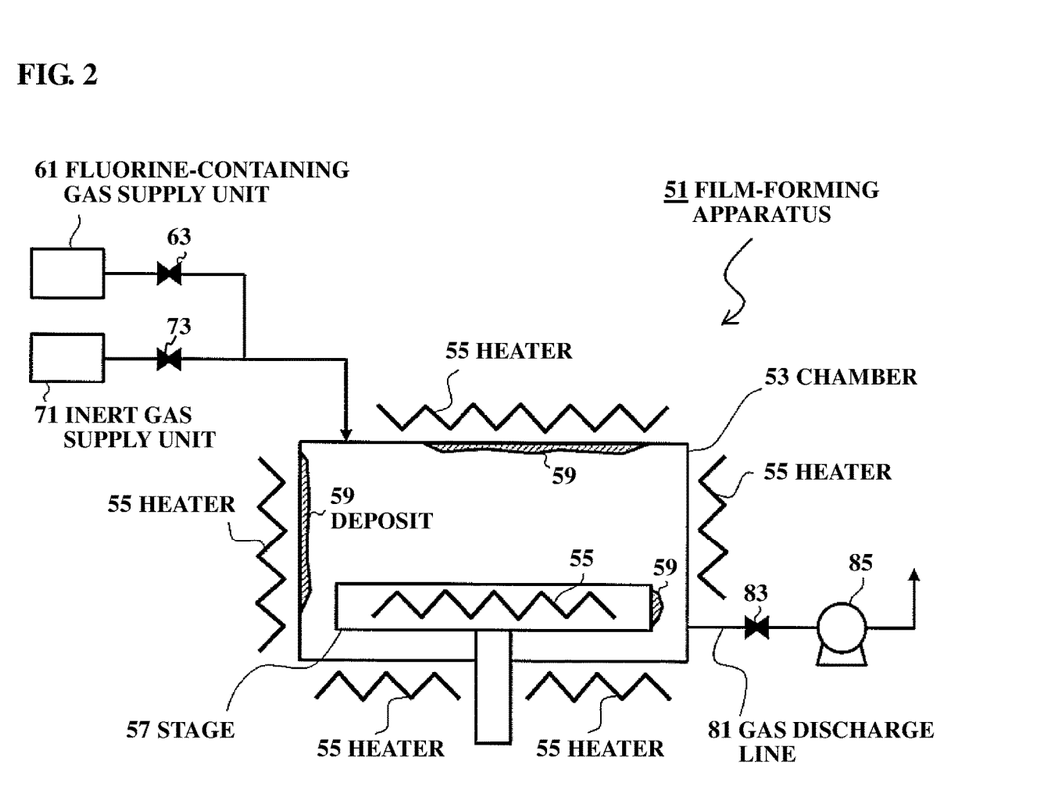
FIG. 2 is a schematic view of a cleaning method of a film forming apparatus according to another embodiment of the present invention.

As shown in FIG. 2, the film forming apparatus 53 has a chamber 53. For used of the film forming apparatus, a treatment target object such as silicon wafer is place on a stage 57 inside the chamber 53; tungsten hexafluoride or molybdenum hexafluoride gas and optionally $H_2$ gas are supplied into the chamber. Then, a film of tungsten, molybdenum or a compound thereof is formed on the treatment target object. During the reaction, a metal fluoride is generated under the influence of water or oxide and left as a deposit 59 on an inner surface of the chamber 55 or piping system and on a surface of the stage 57. The following explanation will be given to the cleaning of the film forming apparatus 51 in which the deposit 59 is present on the inner surface of the chamber 53 and on the surface of the stage 57.

A heater 55 is disposed around the chamber 53 and in the stage 57 such that the inside of the heater can be heated by the heater. The fluorine-containing gas is supplied from a fluorine-containing gas supply unit 61 into the chamber 53, whereas the inert gas is supplied from an inert gas supply unit 71 into the chamber 53. The gas is discharged from the chamber through a gas discharge line 81 by a gas discharge device 85.

The cleaning is performed by supplying the fluorine-containing gas and optionally the inert gas into the chamber 53 while heating the inner surface of the chamber 53 and the surface of the stage 57 to a predetermined temperature by the heater 15 as needed or leaving the inner surface of the chamber 53 and the surface of the stage 57 at room temperature. When the fluorine-containing gas is reacted with the deposit 59 of metal oxyfluoride, the metal oxyfluoride is converted to a metal hexafluoride and thus removed as a volatile gas. In the case where the deposit is present on an inner surface of the piping system such as gas discharge line 81 connected to the chamber 53, the deposit is cleaned away from the piping system by supplying the fluorine-containing gas and optionally the inert gas into the piping system while heating the piping system by a heater disposed therearound or leaving the piping system at room temperature.

In this method, the deposit 59 inside the film forming apparatus 51 is removed by a dry process without the use of a plasma generator and with the chamber 53 being open to the atmosphere.

EXAMPLES

Figure 3:
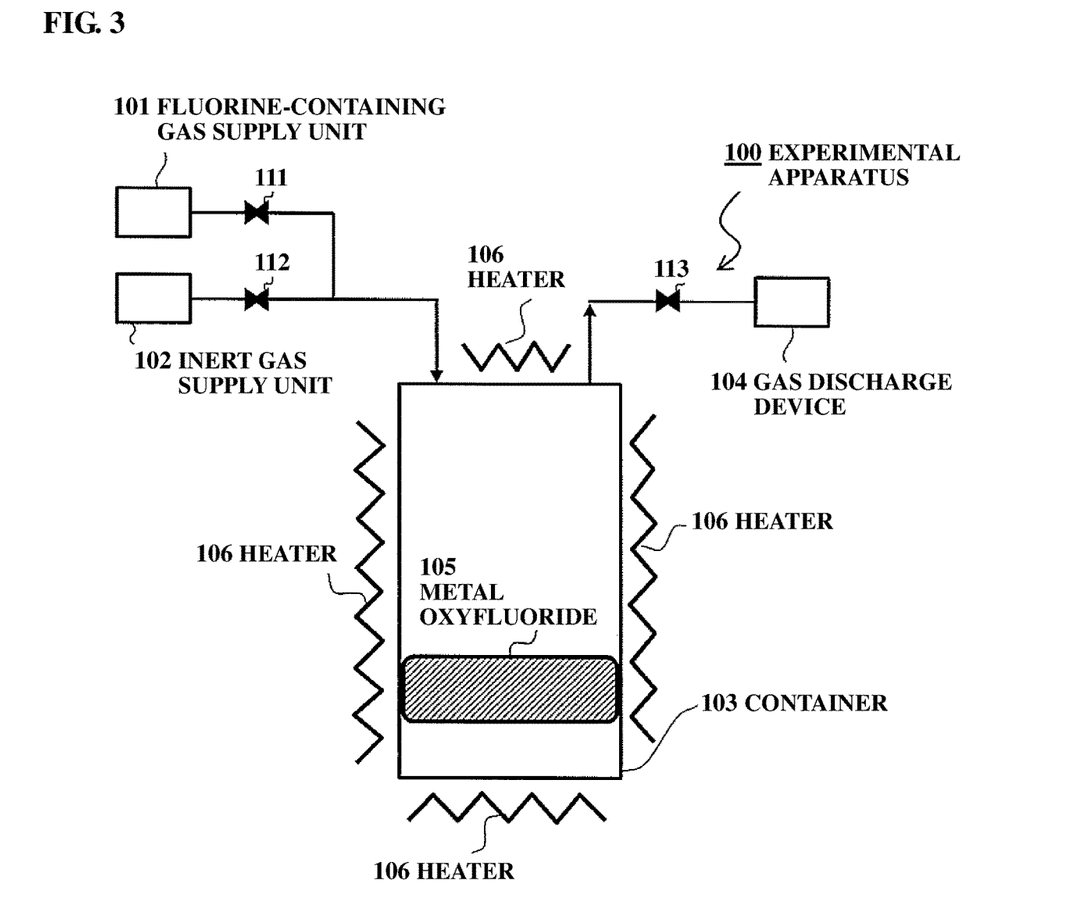
FIG. 3 is a schematic view of an experimental apparatus used in Examples to evaluate a treatment method for a metal oxyfluoride.

The treatment method for the metal oxyfluoride according to the present invention will be described in more detail below by way of the following examples. FIG. 3 is a schematic view of an experimental apparatus used in Examples to evaluate the treatment method for the metal oxyfluoride. It should be understood that the treatment method for the metal oxyfluoride according to the present invention is not limited to the following examples.

Example 1

In a container 103 of 100 $cm^3$ volume, 33 g of tungsten oxyfluoride as a metal oxyfluoride 105 is charged. The inside of the container was replaced with nitrogen gas by supplying nitrogen gas from an inert gas supply unit 102 into the container and vacuuming the container with a gas discharge device 104. Fluorine gas was introduced from a fluorine-containing gas supply unit 101 into the container until the inside of the container reached an absolute pressure of 100 kPa as measured by a pressure gauge (not shown). The fluorine gas was thus brought into contact with the metal oxyfluoride 105. At this time, the molar ratio of the metal oxyfluoride to the fluorine gas was 30. Further, the temperature of the container 103 was set to 20° C. by a heater 106. In this state, the metal oxyfluoride was left still in the container for 2 hours. After that, a part of the gas in the container 103 was taken out as a sample. The concentration of tungsten hexafluoride in the sample gas was measured with an infrared spectrometer. Based on the measurement result, the conversion rate of the fluorine-containing gas was calculated. The conversion rate refers to the proportion of fluorine gas consumed for conversion of the metal oxyfluoride to the tungsten hexafluoride during the reaction time of 2 hours among the fluorine gas introduced into the container. As a result, the conversion rate of the fluorine gas was 1%. The longer the reaction rate, the higher the conversion rate.

Example 2

The contact reaction of the fluorine-containing gas and the metal oxyfluoride was carried out in the same manner as in Example 1, except that nitrogen trifluoride gas was used as the fluorine-containing gas. As a result, the conversion rate of the nitrogen trifluoride gas was 1%.

Example 3

The contact reaction of the fluorine-containing gas and the metal oxyfluoride was carried out in the same manner as in Example 1, except that chlorine trifluoride gas was used as the fluorine-containing gas. As a result, the conversion rate of the chlorine trifluoride gas was 53%.

Example 4

The contact reaction of the fluorine-containing gas and the metal oxyfluoride was carried out in the same manner as in Example 1, except that idodine heptafluoride gas was used as the fluorine-containing gas. As a result, the conversion rate of the idodine heptafluoride gas was 43%.

Example 5

The contact reaction of the fluorine-containing gas and the metal oxyfluoride was carried out in the same manner as in Example 1, except that molybdenum oxyfluoride was used as the metal oxyfluoride. As a result, the conversion rate of the fluorine gas was 1%.

Example 6

The contact reaction of the fluorine-containing gas and the metal oxyfluoride was carried out in the same manner as in Example 2, except that molybdenum oxyfluoride was used as the metal oxyfluoride. As a result, the conversion rate of the nitrogen trifluoride gas was 1%.

Example 7

The contact reaction of the fluorine-containing gas and the metal oxyfluoride was carried out in the same manner as in Example 3, except that molybdenum oxyfluoride was used as the metal oxyfluoride. As a result, the conversion rate of the chlorine trifluoride gas was 65%.

Example 8

The contact reaction of the fluorine-containing gas and the metal oxyfluoride was carried out in the same manner as in Example 4, except that molybdenum oxyfluoride was used as the metal oxyfluoride. As a result, the conversion rate of the idodine heptafluoride gas was 57%.

Example 9

The contact reaction of the fluorine-containing gas and the metal oxyfluoride was carried out in the same manner as in Example 1, except that the temperature of the container 103 was set to 150° C. by the heater 106. As a result, the conversion rate of the fluorine gas was 19%.

Example 10

The contact reaction of the fluorine-containing gas and the metal oxyfluoride was carried out in the same manner as in Example 2, except that the temperature of the container 103 was set to 150° C. by the heater 106. As a result, the conversion rate of the nitrogen trifluoride gas was 14%.

Example 11

The contact reaction of the fluorine-containing gas and the metal oxyfluoride was carried out in the same manner as in Example 3, except that the temperature of the container 103 was set to 150° C. by the heater 106. As a result, the conversion rate of the chlorine trifluoride gas was 86%.

Example 12

The contact reaction of the fluorine-containing gas and the metal oxyfluoride was carried out in the same manner as in Example 4, except that the temperature of the container 103 was set to 150° C. by the heater 106. As a result, the conversion rate of the idodine heptafluoride gas was 78%.

Example 13

The contact reaction of the fluorine-containing gas and the metal oxyfluoride was carried out in the same manner as in Example 9, except that molybdenum oxyfluoride was used as the metal oxyfluoride. As a result, the conversion rate of the fluorine gas was 25%.

Example 14

The contact reaction of the fluorine-containing gas and the metal oxyfluoride was carried out in the same manner as in Example 10, except that molybdenum oxyfluoride was used as the metal oxyfluoride. As a result, the conversion rate of the nitrogen trifluoride gas was 16%.

Example 15

The contact reaction of the fluorine-containing gas and the metal oxyfluoride was carried out in the same manner as in Example 11, except that molybdenum oxyfluoride was used as the metal oxyfluoride. As a result, the conversion rate of the chlorine trifluoride gas was 89%.

Example 16

The contact reaction of the fluorine-containing gas and the metal oxyfluoride was carried out in the same manner as in Example 12, except that molybdenum oxyfluoride was used as the metal oxyfluoride. As a result of the reaction, the conversion rate of the idodine heptafluoride gas was 80%.

Comparative Example 1

The contact reaction of the fluorine-containing gas and the metal oxyfluoride was carried out in the same manner as in Example 1, except that nitrogen gas was supplied from the inert gas supply unit in place of the fluorine-containing gas. As a result, the formation of tungsten hexafluoride was not seen. It was impossible to calculate the conversion rate.

Comparative Example 2

The contact reaction of the fluorine-containing gas and the metal oxyfluoride was carried out in the same manner as in Example 5, except that nitrogen gas was supplied from the inert gas supply unit in place of the fluorine-containing gas. As a result, the formation of molybdenum hexafluoride was not seen. It was impossible to calculate the conversion rate.

Comparative Example 3

The contact reaction of the fluorine-containing gas and the metal oxyfluoride was carried out in the same manner as in Comparative Example 1, except that the temperature of the container 103 was set to 150° C. by the heater 106. As a result, the formation of tungsten hexafluoride was not seen. It was impossible to calculate the conversion rate.

Comparative Example 4

The contact reaction of the fluorine-containing gas and the metal oxyfluoride was carried out in the same manner as in Comparative Example 2, except that the temperature of the container 103 was set to 150° C. by the heater 106. As a result, the formation of molybdenum hexafluoride was not seen. It was impossible to calculate the conversion rate.

The above examples and comparative examples are summarized in TABLE 2.

TABLE 2

| Example/Comparative Example | Fluorine-containing gas | Metal oxyfluoride | Metal oxyfluoride/fluorine-containing gas molar ratio (mol/mol) | Temp. (° C.) | Conversion rate (%) of fluorine-containing gas |
|---|---|---|---|---|---|
| Example 1 | $F_2$ | $WOF_4$ | 30 | 20 | 1% |
| Example 2 | $NF_3$ | $WOF_4$ | 30 | 20 | 1% |
| Example 3 | $ClF_3$ | $WOF_4$ | 30 | 20 | 53% |
| Example 4 | $IF_7$ | $WOF_4$ | 30 | 20 | 43% |
| Example 5 | $F_2$ | $MoOF_4$ | 30 | 20 | 1% |
| Example 6 | $NF_3$ | $MoOF_4$ | 30 | 20 | 1% |
| Example 7 | $ClF_3$ | $MoOF_4$ | 30 | 20 | 65% |
| Example 8 | $IF_7$ | $MoOF_4$ | 30 | 20 | 57% |
| Example 9 | $F_2$ | $WOF_4$ | 30 | 150 | 19% |
| Example 10 | $NF_3$ | $WOF_4$ | 30 | 150 | 14% |
| Example 11 | $ClF_3$ | $WOF_4$ | 30 | 150 | 86% |
| Example 12 | $IF_7$ | $WOF_4$ | 30 | 150 | 78% |
| Example 13 | $F_2$ | $MoOF_4$ | 30 | 150 | 25% |
| Example 14 | $NF_3$ | $MoOF_4$ | 30 | 150 | 16% |
| Example 15 | $ClF_3$ | $MoOF_4$ | 30 | 150 | 89% |
| Example 16 | $IF_7$ | $MoOF_4$ | 30 | 150 | 80% |
| Comparative Example 1 | $N_2$ | $WOF_4$ | 30 | 20 | — |
| Comparative Example 2 | $N_2$ | $MoOF_4$ | 30 | 20 | — |
| Comparative Example 3 | $N_2$ | $WOF_4$ | 30 | 150 | — |
| Comparative Example 4 | $N_2$ | $MoOF_4$ | 30 | 150 | — |

As shown above, each of $F_2$ gas, $NF_3$ gas, $ClF_3$ gas and $IF_7$ gas was reacted with the tungsten oxyfluoride and with the molybdenum oxyfluoride even at 20° C. On the other hand, N2 gas was not reacted with the tungsten oxyfluoride and with the molybdenum oxyfluoride even at 150° C. In other words, these metal oxyfluorides were each converted to the metal hexafluoride by reaction with the fluorine-containing gas such as $F_2$ gas and thereby removed. In particular, the heated reaction temperature of 150° C. leads to a higher conversion rate and a higher reaction rate than the reaction temperature of 20° C. The use of $ClF_3$ gas or $IF_7$ gas led to a higher conversion rate and a higher reaction rate than the use of $F_2$ gas or $NF_3$ gas.

DESCRIPTION OF REFERENCE NUMERALS

11: Metal fluoride production apparatus
13: Reactor
15: Heater
17: Deposit
21: Fluorine-containing gas supply unit
23: Valve
31: Inert gas supply unit
33: Valve
41: Gas discharge line
43: Valve
45: Gas discharge device
51: Film forming apparatus
53: Chamber
55: Heater
57: Stage
59: Deposit
61: Fluorine-containing gas supply unit
63: Valve
71: Inert gas supply unit
73: Valve
81: Gas discharge line
83: Valve
85: Gas discharge device
100: Experimental apparatus
101: Fluorine-containing gas supply unit
102: Inert gas supply unit
103: Container
104: Gas discharge device
105: Metal oxyfluoride
106: Heater
111, 112, 113: Valve

The invention claimed is:

1. A treatment method for a metal oxyfluoride, comprising bringing a metal oxyfluoride of the general formula: $MO_{(6-x)/2}F_x$ (where 0<x<6; and M=W or Mo) into contact with at least one kind of fluorine-containing gas selected from the group consisting of $F_2$ gas, $NF_3$ gas, $ClF_3$ gas, and $IF_7$ gas at a reaction temperature ranging from 10° C. to 200° C., thereby converting the metal oxyfluoride to a metal hexafluoride of the general formula: $MF_6$ (where M=W or Mo).

2. The treatment method according to claim 1, wherein a contact pressure of the metal oxyfluoride and the fluorine-containing gas is 0.01 kPa to 300 kPa in terms of absolute pressure.

3. A cleaning method of a metal fluoride production apparatus, the metal fluoride production apparatus being configured for producing a metal hexafluoride of the general formula: $MF_6$ (where M=W or Mo), the cleaning method comprising: converting a metal oxyfluoride of the general formula: $MO_{(6-x)/2}F_x$ (where 0<x<6; and M=W or Mo) deposited on an inner surface of the metal fluoride production apparatus to a metal hexafluoride by the treatment method according to claim 1 and thereby removing the metal oxyfluoride.

4. A cleaning method of a film forming apparatus, the film forming apparatus being configured for forming a film from a metal hexafluoride of the general formula: $MF_6$ (where M=W or Mo), the cleaning method comprising: converting a metal oxyfluoride of the general formula: $MO_{(6-x)/2}F_x$ (where 0<x<6; and M=W or Mo) deposited on an inner surface of the film forming apparatus to a metal hexafluoride by the treatment method according to claim 1 and thereby removing the metal oxyfluoride.

5. The treatment method according to claim 1, wherein the fluorine-containing gas is $F_2$ gas.

6. The treatment method according to claim 1, wherein the fluorine-containing gas is $NF_3$ gas.

7. The treatment method according to claim 1, wherein the fluorine-containing gas is $ClF_3$ gas.

8. The treatment method according to claim 1, wherein the fluorine-containing gas is $IF_7$ gas.

9. The treatment method according to claim 1, wherein, in the general formula: $MO_{(6-x)/2}F_x$, x is 4.

10. The treatment method according to claim 1, wherein the fluorine-containing gas is diluted with an inert gas so that the fluorine-containing gas diluted with the inert gas comes into contact with the metal oxyfluoride.

11. The treatment method according to claim 1, wherein the metal oxyfluoride is brought into contact with the nitrogen-containing gas in a plasmaless manner.

\* \* \* \* \*